United States Patent
Tarzwell

[19]

[11] Patent Number: 6,034,532
[45] Date of Patent: *Mar. 7, 2000

[54] RESILIENT CONNECTOR HAVING A TUBULAR SPRING

[75] Inventor: Patrick James Tarzwell, Mesa, Ariz.

[73] Assignee: AlphaTest Corporation, Mesa, Ariz.

[*] Notice: This patent is subject to a terminal disclaimer.

[21] Appl. No.: 08/820,832

[22] Filed: Mar. 19, 1997

Related U.S. Application Data

[63] Continuation-in-part of application No. 08/084,623, Jul. 1, 1993, Pat. No. 5,982,187.
[51] Int. Cl.$^7$ .................................................. G01R 31/00
[52] U.S. Cl. .............................................. 324/761; 324/754
[58] Field of Search ................................... 324/754, 755, 324/72.5, 761, 762; 439/824, 482; 29/896.8, 896.9

[56] References Cited

U.S. PATENT DOCUMENTS

| | | | |
|---|---|---|---|
| 3,996,516 | 12/1976 | Luther | 324/754 |
| 4,138,643 | 2/1979 | Becker et al. | 324/754 |
| 4,321,532 | 3/1982 | Luna | 324/72.5 |
| 4,773,877 | 9/1988 | Hart | 324/754 |
| 4,841,240 | 6/1989 | Hsue et al. | 324/537 |
| 5,124,646 | 6/1992 | Shiraishi | 439/482 |
| 5,489,916 | 2/1996 | Waterman et al. | 343/895 |

*Primary Examiner*—Vinh P. Nguyen
*Attorney, Agent, or Firm*—Cahill, Sutton & Thomas P.L.C.

[57] ABSTRACT

A resilient connector uses a spring made from a cylindrical tube. The wall of the tube is cut in a helix along the central portion of the tube to form the spring. One or more plungers within the spring have a tip extending past a first end of the spring and a second end attached to the spring. Each plunger is a pin or a pair of coaxial conductors separated by a dielectric sheath. One of the coaxial conductors is a conductive layer on the sheath. A double ended connector uses a spring made as described above with a pair of plungers attached one each to each end of the spring.

10 Claims, 2 Drawing Sheets

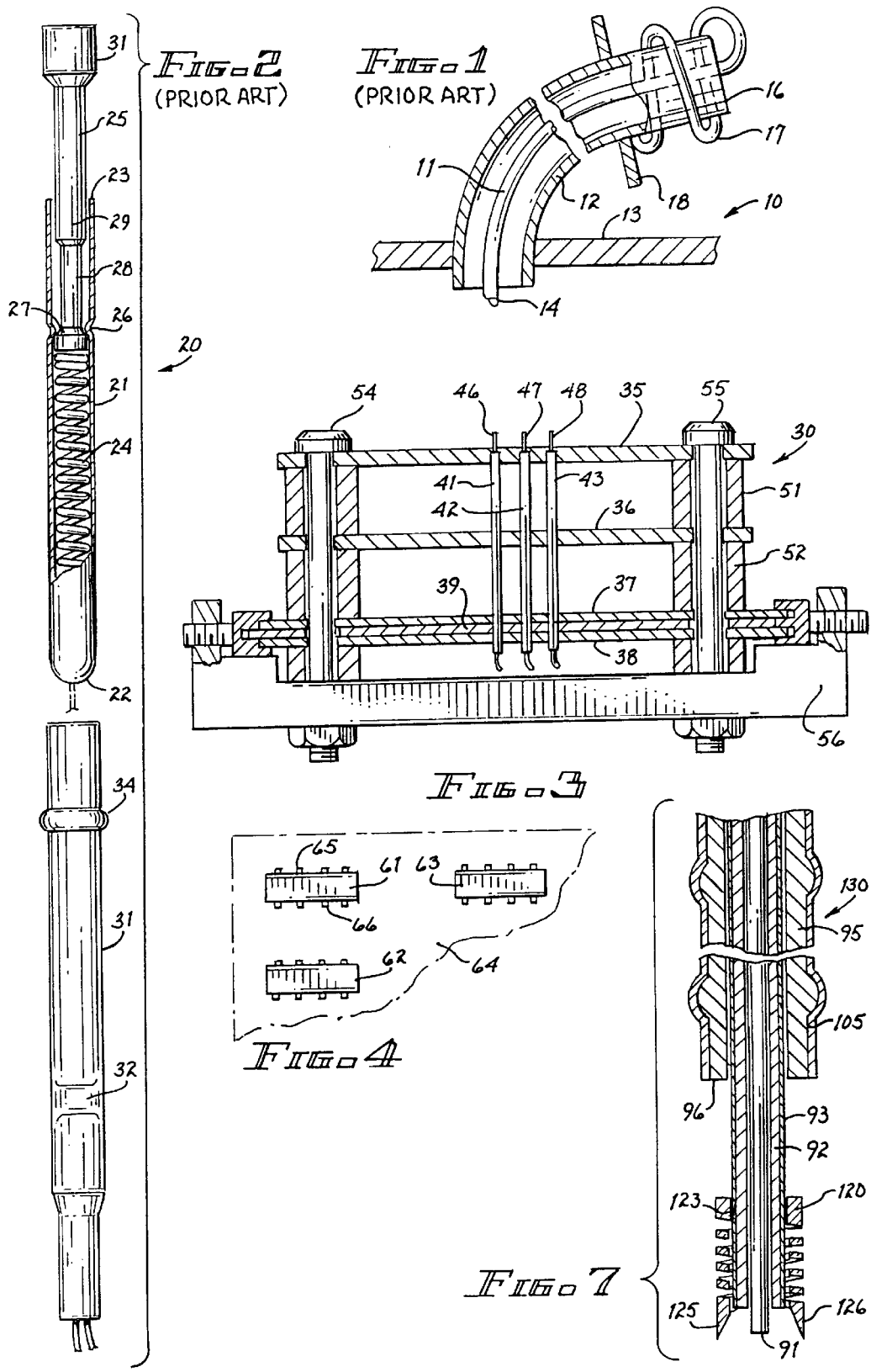

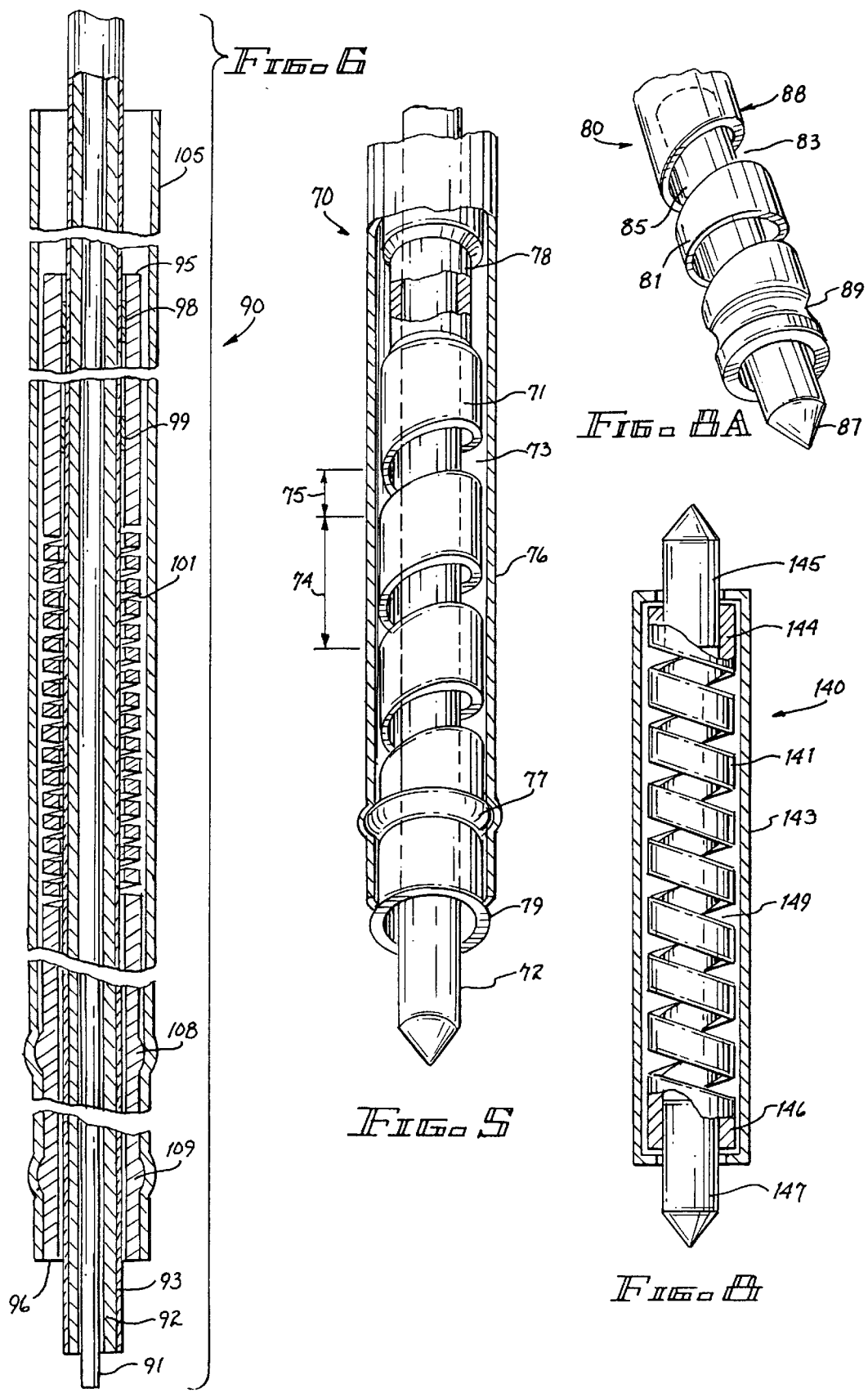

RESILIENT CONNECTOR HAVING A TUBULAR SPRING

CROSS-REFERENCE TO RELATED APPLICATION

This application is a continuation-in-part of application Ser. No. 08/084,623 filed Jul. 1, 1993, (now U.S. Pat. No. 5,982,187) and assigned to the assignee of this invention.

BACKGROUND OF THE INVENTION

This invention relates to resilient connectors and, in particular, to a resilient probe including a spring made from a tube having a helical cut along its length.

Resilient probes have been used for many years to make electrical connections to printed circuit boards and hybrid substrates for testing. In the past, electrical contacts on printed circuit boards were relatively widely spaced, e.g. 50–200 mils (1.3–5.0 mm) center to center. Integrated circuits have become much smaller and contact spacing has decreased, making it increasingly difficult to obtain a reliable connection for testing. For example, surface mount devices have a contact spacing of 8–15 mils (0.2–0.4 mm).

Commercially available resilient probes have four or five components, typically including an elongated probe body or barrel having a spring in a closed end and a plunger resting on the spring and extending from an open end of the barrel. A portion of the plunger fits closely within the barrel to provide electrical contact between the plunger and the barrel. The barrel can be mounted directly in a fixture in an array with other probes or can be mounted in a conductive tube or receptacle which is mounted in a fixture in an array with other probes. When the tip of the plunger is pressed onto a contact area, the plunger is pushed into the barrel, compressing the spring against the closed end of the barrel. For example, U.S. Pat. No. 5,004,977 (Kazama) discloses such a probe.

Resilient probes of the prior art rely on a wiping contact between the plunger and the barrel. The wiping contact wears after a number of operations and may degrade electrical performance. In addition, the rubbing surfaces are subject to corrosion and particle contamination. The prior art has attempted to overcome this problem by soldering one end of the spring to the plunger and soldering the other end of the spring to the barrel.

A probe in which the spring is not soldered conducts a signal from the tip of the probe through the wiping contact between the plunger and the barrel to a lead attached to the barrel. Soldering the spring may eliminate the problem of intermittent contact but introduces an inductor into the circuit: the helical spring. When a soldered spring is used, the signal is conducted from the tip of the plunger through the spring to the barrel. The inductance of the spring can be significant at very high frequency, especially for circuits generating square waves rather than sinusoidal waves. The inductance can cause degradation of the signal, e.g. distortion of a square wave, phase distortion, or impedance changes.

Resilient probes tend to be electrically long in terms of the wavelength of the signal passing through the probe. For example, a probe 7.5 cm long is one quarter wavelength long at 1000 Mhz. It is preferred to have a probe much less than one tenth of a wavelength long to minimize problems with discontinuities and reflections. The several components in a probe of the prior art can cause discontinuities and reflections to occur. A coaxial probe of the prior art is electrically like a coaxial cable having a number of joints or connections in the cable. Each joint in the cable is a discontinuity and can cause reflections, particularly if adjoining segments of the cable do not have the same impedance. The same is true within a probe.

In addition to close pin spacing and very high frequency signals, modern printed circuit boards often have concentric contact areas. For example, some devices have a lead which is not grounded but is held at ground potential. This "driven ground" is difficult or impossible to access with a probe. Another problem is the separation of voltage and current terminals for resistance measurements. Precise measurement of resistance requires that the current through a device be applied from a first set of terminals and the voltage drop across the device be measured from a separate pair of terminals. Otherwise, one is measuring the voltage drop of the device plus the voltage drops across the two contacts to the device. Since the current and voltage terminals are closely space, probes of the prior art have not been able to separately access these terminals. Thus, there is a need in the art to be able to contact concentric or closely spaced terminals, e.g. signal, driven ground, and electrical ground or current, voltage, and ground terminals.

The restoring force in a typical resilient probe comes from a compressed, helical spring. As industry attempts to miniaturize probes to keep pace with circuit density, there is a problem in that reducing the size of the spring reduces the restoring force provided by the spring. This limits the amount one can miniaturize a resilient probe constructed as known in the prior art.

A helical spring increases in diameter when compressed, requiring that the inside diameter of the barrel be larger than the nominal outside diameter of the spring in order to provide adequate clearance for the spring and to prevent binding. Binding is particularly likely when the plunger is subjected to excessive travel, possibly jamming one coil between another coil and the barrel. The variable diameter of the spring may adversely affect high frequency performance, especially in a coaxial probe.

In many applications, e.g. hard drives for computers and optical disc players, a resilient connection is made to a linearly moving head for reading or writing data. Typically, the resiliency of fine wires is relied upon for a resilient electrical connection between the head and the rest of the circuitry. For many applications, it is desired to obtain a more rugged, but no less resilient, connection. Particularly for data scanning applications, mechanical stability and repeatable motion are of paramount importance.

In view of the foregoing, it is therefore an object of the invention to provide a resilient connector which can easily be miniaturized.

Another object of the invention is to provide a resilient probe suitable for very high frequency signals.

A further object of the invention is to provide a resilient probe which can be arranged with like probes in an array having a center to center spacing of less than 10 mils.

Another object of the invention is to provide a resilient probe having fewer discontinuities than probes of the prior art.

A further object of the invention is to provide a resilient connector having a large over-drive capability.

Another object of the invention is to provide a resilient connector having improved stability and repeatable motion.

SUMMARY OF THE INVENTION

The foregoing objects are achieved in the invention in which a resilient probe uses a spring made from a cylindrical tube. In accordance with a first aspect of the invention, the wall of the tube is cut in a helix along the central portion of the tube to form the spring. Because the spring is not wound on a mandrel, there are no built-in stresses and the spring is dimensionally very stable, particularly if the tube is made from quartz. A quartz spring has no "memory" even after thousands of cycles. The spring is also self-limiting since the coils of the spring have a rectangular cross-section. Compressing the spring may cause the coils to touch, but the coils cannot move past each other or jam as with springs having coils with a round cross-section. Thus, the coils bottom out and the spring is as rigid lengthwise as the tube from which it was made.

In accordance with another aspect of the invention, a double ended connector uses a spring made as described above, but compressed rather than extended during use. A plunger is attached to each end of the spring and the dimensional stability of the spring maintains the alignment of the plungers, assuring reliable connection.

In accordance with a third aspect of the invention, a spring and a barrel are combined to further reduce the diameter of the probe. A tube has a helical cut at one end and a plunger is attached to that end. The tube is attached to a receptacle by the uncut portion of the tube.

In all aspects of the invention, the probe presents no joints to the signal on the plunger, i.e. there is an unbroken path from the circuit board through the plunger.

BRIEF DESCRIPTION OF THE DRAWINGS

A more complete understanding of the invention can be obtained by considering the following detailed description in conjunction with the accompanying drawings, in which:

FIG. 1 illustrates a prior art probe using a conductor for an extensible spring at the proximal end of the probe;

FIG. 2 illustrates a probe and receptacle constructed in accordance with the prior art;

FIG. 3 illustrates a fixture for holding a plurality of probes;

FIG. 4 illustrates a portion of a circuit board to be tested;

FIG. 5 illustrates a probe constructed in accordance with the invention;

FIG. 6 is a cross-sectional view of a coaxial probe constructed in accordance with the invention;

FIG. 7 is a cross-sectional view of a coaxial probe constructed in accordance with an alternative embodiment of the invention;

FIG. 8 is a partial cross-section of a double ended connector constructed in accordance with the invention;

FIG. 8A is a perspective view of a compressible spring constructed in accordance with an alternative embodiment of the invention.

DETAILED DESCRIPTION OF THE INVENTION

FIG. 1 illustrates a resilient probe having an extensible spring. This probe is commercially available from AlphaTest Corporation and is sold under the tradename "Heliprobe." Probe 10 includes conductor 11 longitudinally movable within jacket 12. Free end 14 of conductor 11 extends past the end of jacket 12 which is held in fixture 13. The proximal end of conductor 11 is wound back over end 16 of jacket 12, forming helical spring 17. The end of spring 17 is attached to jacket 12 by clip 18.

In use, end 14 is pressed against a contact on a printed circuit board, causing conductor 11 to move longitudinally within jacket 12 and extend spring 17.

FIG. 2 illustrates another type of resilient probe, commercially available from Interconnect Devices, Inc. and other manufacturers. Probe 20 includes elongated barrel 21 having closed end 22 and open end 23. Spring 24 is contained within barrel 21, resting against closed end 22. Plunger 25 rests on spring 24 and extends past open end 23. Portion 29 of plunger 25 fits closely within barrel 21 to provide a sliding electrical contact between the plunger and the barrel. Reduced diameter portion 28 of plunger 25 reduces friction between the plunger and barrel 21 and provides clearance for detent 26 in the barrel. Plunger tail 27 is trapped behind detent 26 to prevent plunger 25 from falling out of barrel 21. Plunger head or tip 31 is shown as having a concave or socket shape, which is only one of the many shapes used for probe tips. When tip 31 is pressed onto a contact area, plunger 25 is pushed into barrel 21, compressing spring 24 against closed end 22.

Barrel 21 can be mounted directly in a fixture in an array with other probes or can be mounted in a conductive tube or receptacle which is mounted in a fixture in an array with other probes. Receptacle 31 has an inside diameter slightly greater than the outside diameter of barrel 21 and holds the barrel by means of crimp or detent 32. Interference ring or press ring 34 is a slightly enlarged diameter for frictionally engaging a fixture to hold receptacle 31 securely in place.

FIG. 3 illustrates a fixture for holding a plurality of probes in an array having the same pattern as the contact pattern on a printed circuit board or a hybrid circuit. Fixture 30 includes spaced apart retaining plates 35–39, each retaining plate having a plurality of aligned holes for receiving resilient probes 41–43. Plates 37–39 form a sandwich. Shear plate 39 is moveable from side to side, thereby applying a shear force to probes 41–43 and holding the probes in place. Retaining plates 35, 36, and 37–39 are separated by suitable spacers, such as spacers 51 and 52, and are held together by screws 54 and 55 which pass through the retaining plates and spacers, attaching them to frame 56. Tips 46–48 of probes 41–43 are approximately coplanar and any difference in height is compensated by the resiliency of the probes.

In FIG. 4, integrated circuits 61–63 are mounted on printed circuit board 64, forming a pattern of contact areas. Resilient pins 41–43, and several others, are held in array in a pattern corresponding to the pattern of the contact areas, such as areas 65 and 66. In order to test the circuit, pins 41–43 are lowered over the contact areas by suitable alignment apparatus (not shown) and make electrical contact with the integrated circuits. Any irregularity in the height of the areas, e.g. solder thickness, is compensated by the resiliency of the probes.

FIG. 5 illustrates a probe constructed in accordance with a preferred embodiment of the invention. Probe 70 includes tubular spring 71 concentric with plunger 72. The wall of tubular spring 71 includes helical cut 73 extending for several complete turns about the middle portion of spring 71. In a preferred embodiment of the invention, the spacing of the turns, denoted by reference numeral 74, is 1.1–5 times the width of the cut, denoted by reference numeral 75.

As a specific example of a spring made in accordance with the invention, a quartz tube having an outside diameter of six mils had a cut one mil wide forming coils having a spacing of three mils. The quartz tube was cut on a lathe having screw thread capability using a diamond saw such as is used in the semiconductor industry for cutting a wafer into die. The number of turns cut into the tube is determined by the amount of travel of the plunger and the material from which the tube is made. For a quartz tube having an outside diameter of six mils, thirty turns have been used, permitting a longitudinal displacement of fifteen mils by plunger 72.

Spring 71 preferably includes press ring 77 for attaching the distal end of the spring to barrel 76. Barrel 76 has a suitable socket or groove on the inside diameter thereof for receiving press ring 77. The proximal end of spring 71 is attached to plunger 72 by crimp 78. Any suitable means for mechanical connecting plunger 72 to spring 71 can be used, e.g. a crimp, solder, or adhesive. Since the proximal end of spring 71 is attached to plunger 72, pressing probe 70 to a contact causes spring 71 to extend. The extension of spring 71 can cause the inside diameter of spring 71 to be reduced. If this reduction takes place, spring 71 simply constricts about plunger 72 and cannot bind. The distal end of spring 71 preferably includes flare 79 to prevent the end of spring 71 from gouging plunger 72 if plunger 72 is moved laterally while being pressed against a contact area.

Electrical contact is made to the proximal end of plunger 72. Since electrical contact is made directly to plunger 72, spring 71 can be any suitable resilient material, whether or not electrical conductive. Spring 71 is preferably made from quartz or beryllium copper and can be made from other metals or from plastic, depending upon the particular application. A variety of materials are known in the art for making the plunger and barrel. For example, plunger 72 can be tungsten, beryllium copper or stainless steel and barrel 76 can be copper or brass.

FIG. 6 illustrates coaxial probe 90 constructed in accordance with the invention. The plunger of probe 90 includes center conductor 91 surrounded by dielectric sheath 92. The coaxial outer conductor of the plunger is layer 93. Layer 93 is an adherent layer of a suitable conductor, preferably chrome-platinum but other metals are suitable, such as aluminum, copper, or gold alloy. A layer of pure gold would not be used because gold is too soft and would abrade as the plunger moves within the probe. An alloy of copper and gold or copper, gold, and beryllium can be used.

The end of the plunger is inserted through spring 95 and extends past distal end 96 of spring 95. The proximal end of spring 95 is attached to layer 93 by any suitable means such as solder glass or adhesive, as shown at reference numerals 98 and 99. Spring 95 is preferably a quartz tube having multi-turn, helical cut 101 made in the central portion thereof. The number of turns is not critical and depends upon the properties of the tube from which the spring is made. Surrounding spring 95 is barrel 105 which is attached to spring 95 near distal end 96 by pressure rings 108 and 109 in spring 95. The pressure rings form an interference fit with barrel 105 and hold the spring securely.

Spring 95 stretches as center conductor 91 is pressed against a contact on a printed circuit board. Since layer 93 surrounds center conductor 91 along its entire length, the center conductor is fully shielded, greatly improving the high frequency capability of probe 90 and decreasing the chance that a stray signal will be coupled inadvertently to center conductor 91. Spring 95 is outside layer 93, the outer conductor of the coaxial plunger. Thus, electrical signals are not coupled through spring 95 and the spring can be made from insulating or conductive material. Even if made from electrically conductive material, spring 95 does not contribute any inductance to the probe.

FIG. 7 illustrates an alternative embodiment of the invention in which a resilient tip is added to the probe for connection to a ground terminal on a printed circuit board or hybrid substrate. Spring 120 is a tubular spring attached to outer layer 93, e.g. by solder 123. Spring 120 has points or prongs 125, 126 which extend slightly past the distal end of center conductor 91. The geometry of the lower end of spring 120 is determined by the particular application and can include one or more points or a ring concentric with center conductor 91. As probe 130 is brought into contact with a printed circuit board, spring 120 makes initial contact with a ground pad or contact area and spring 120 compresses slightly, permitting center conductor 91 to make contact with a signal terminal on the device under test. Spring 120 is compressed rather than extended. In this embodiment, layer 93 is grounded at each end thereof, preventing ground loops or other problems in testing a circuit.

FIG. 8 illustrates a double ended, resilient connector constructed in accordance with another aspect of the invention. In this embodiment, connector 140 includes spring 141 within barrel 143. Spring 141 is a tube having a multi-turn helical cut therein to provide resiliency along the length of the spring. End 144 of spring 141 is attached plunger 145 and end 146 of spring 141 is attached to plunger 147. The plungers extend past the ends of barrel 143 for making resilient contact. In this embodiment, spring 141 is compressed rather than extended as connection is made. The amount of travel for plungers 145 and 147 is determined by the width of cut 149 and the number of turns.

FIG. 8A illustrates a compressible connector including a tube and a plunger without a barrel. Specifically, connector 80 includes tube 81 having helical cut 83 near one end thereof. Plunger 85 includes tip 87 extending from the end of tube 81 and the plunger is held in place by crimp 89. Adhesive or solder could be used instead for fastening plunger 85 in place, depending upon the particular application. The rigidity of the tube and the dimensional stability of the spring allow probe 80 to be used without a barrel by fastening tube 81 along an uncut portion of the tube. The absence of a barrel further reduces the diameter of the probe, enabling even closer spacing of the probes in an array.

Preferably, plunger 85 is sufficiently long to extend from outside tube 81 to uncut portion 88. This construction assures the mechanical stability of the plunger and also provides an electrical short of the inductance of the spring. Although the contact between the inner end of plunger 85 and uncut portion 88 is a sliding contact, this is not the only or the primary path for current through the tube. The primary path is from tip 87 through crimp 89. Thus, one retains a low resistance, low inductance path for signals from tip 89.

A double-ended probe can be made from a single tube by cutting a spring in the end portions of the tube, as illustrated in FIG. 8A. The middle portion of the tube is used for fastening the probe in an array. As with the other embodiments, the tube can be made from metal, plastic, glass or quartz. The tube need not be a true cylinder but can be bent as needed for a particular application, e.g. as illustrated by jacket 12 in FIG. 1 or to change probe spacing between opposite sides of an array.

Having thus described the invention it will be apparent to those of skill in the art that various modifications can be made within the scope of the invention. For example, the probe shown in FIG. 1 can be improved by using a spring constructed in accordance with the invention. In the embodiment shown in FIG. 8, the travel of plunger 145 decreases the available travel for plunger 147. While a single spring is illustrated in FIG. 8, it is understood that more than one spring can be used. Specifically, concentric springs can be used, with one spring attached to plunger 145 and one spring attached to plunger 147. The springs are concentric but the helices are in opposite directions, i.e. one helix has a right hand orientation and the other helix has left hand orientation. This complementary orientation prevents the springs from interfering with one another and provides a bifilar winding of the springs.

In addition to its uses in electrical testing, the resilient probe described can be used for mechanical testing, e.g. dimensional analysis requiring a light touch of a plunger on a device under test located between the plunger and an anvil. Further, since a spring can be made from quartz, one can also utilize the spring as a piezo-electric strain gauge or as a piezo-electric transducer, e.g. applying a voltage to conductive coatings on the spring will cause it to elongate or compress

What is claimed as the invention is:

1. A resilient probe for making contact with an object, said probe comprising:
    a tube having a predetermined length between a first end and a second end and a helical cut along a portion of said length;
    a first plunger fitting within said tube and having a tip extending past the first end of said tube;
    wherein said tube is attached to said first plunger at said first end, whereby said tube compresses when said tip is pressed against said object.

2. The resilient probe as set forth in claim 1 and further including:
    a second plunger fitting within said tube and having a tip extending past the second end of said tube;
    wherein said tube is attached to said second plunger at said second end, whereby said tube compresses when the tip of said second plunger is pressed against said object.

3. The resilient probe as set forth in claim 2 wherein said helical cut extends substantially the length of said tube between said first end and said second end.

4. The resilient probe as set forth in claim 3 wherein said helical cut is located near said first end of said tube.

5. The resilient probe as set forth in claim 4 wherein said tube includes a pair of helical cuts adjacent respective ends of said tube, whereby a middle portion of said tube is uncut.

6. The resilient probe as set forth in claim 3 and further comprising:
    a barrel surrounding said tube and from which the plungers extend.

7. The probe as set forth in claim 1 wherein said tube is metal.

8. The probe as set forth in claim 1 wherein said tube is glass.

9. The probe as set forth in claim 1 wherein said tube is quartz.

10. The probe as set forth in claim 1 wherein said tube is plastic.

* * * * *